United States Patent [19]

Flannery et al.

[11] 4,437,227

[45] Mar. 20, 1984

[54] METHOD OF MAKING IMPROVED TUNNEL BARRIERS FOR SUPERCONDUCTING JOSEPHSON JUNCTION DEVICES

[75] Inventors: William E. Flannery, Norristown; Richard M. Josephs, Willow Grove; Barry F. Stein, Dresher; Tsing-Chow Wang, Norristown; Peter L. Young, North Wales, all of Pa.

[73] Assignee: Sperry Corporation, New York, N.Y.

[21] Appl. No.: 437,386

[22] Filed: Oct. 28, 1982

[51] Int. Cl.³ .............................................. H01L 39/22
[52] U.S. Cl. ........................................ 29/589; 427/63;
427/99; 427/250; 427/255; 427/255.1;
427/255.3; 427/255.7; 156/643
[58] Field of Search .................. 427/63, 99, 250, 255,
427/255.1, 255.3, 255.7; 156/643; 29/589

[56] References Cited

U.S. PATENT DOCUMENTS 4,129,167 12/1978 Sigsbee ................................ 427/250

OTHER PUBLICATIONS

Ames, IBM Journal of Research and Development, vol. 24, No. 2, Mar. 1980, pp. 188–194.
Greiner et al., IBM Journal of Research and Development, vol. 24, No. 2, Mar. 1980, pp. 195–205.

Primary Examiner—John D. Smith
Assistant Examiner—Richard Bueker
Attorney, Agent, or Firm—John B. Sowell; Thomas J. Scott; Marshall M. Truex

[57] ABSTRACT

During the manufacture of Josephson superconducting devices, it is necessary to provide on a substrate a base electrode, a counter electrode and a small tunnel barrier area therebetween. A novel method of making all three of these active elements in the same vacuum chamber without having to remove the substrate from the vacuum chamber is provided so that the tunnel barrier area is accurately made to a predetermined size and without the danger of contamination. The novel structure is made as a substantially planarized laminate in the vacuum chamber and the tunnel barrier area is defined in a supplemental step.

14 Claims, 8 Drawing Figures

METHOD OF MAKING IMPROVED TUNNEL BARRIERS FOR SUPERCONDUCTING JOSEPHSON JUNCTION DEVICES

BACKGROUND OF THE INVENTION

1. Field of the Invention

This invention relates to a new method of making the electrodes and a tunnel barrier therebetween for a Josephson superconducting device. More particularly, this invention relates to a novel method of making a base electrode, a counter electrode and a barrier junction therebetween as uniformly deposited layers of lead materials over a substrate without removing the substrate from a vacuum chamber.

2. Description of the Prior Art

It is well known that superconducting Josephson junction devices comprise a base electrode and a counter electrode having an insulating layer which separates the electrodes except at a window or aperture in which a tunnel barrier junction is formed. The Josephson junction device is placed in a cryogenic environment and presents a superconducting path for the flow of electrical current until a critical current is reached in the barrier junction. Once the critical current is reached in the tunnel barrier junction area between the electrodes, the barrier becomes highly resistive to the flow of current. It is well known that the application of a magnetic field can be used to control the critical current.

Heretofore, the base electrodes of Josephson junction devices have been made by vacuum depositing niobium and niobium alloys, and lead and lead-alloys on a substrate in a vacuum chamber. In subsequent steps the base electrodes have been removed from the vacuum chamber and provided with photoresist mask to form the window on the base electrode which is surrounded by an insulating layer such as silicon oxide. Subsequent steps require that the mask material be removed from the area where the tunnel barrier junction is to be made before the barrier material is deposited. Once the barrier area is exposed, the barrier junction may be made by depositing the barrier material or oxidizing the area in the window. During deposition of the barrier contamination of the tunnel barrier junction proper may result from the surrounding insulating material. The barrier area may also be contaminated during the process of chemically applying or removing the photoresist mask.

To avoid this contamination of the tunnel barrier junction, it has been suggested that the base electrode layer, the tunnel barrier junction and the counter electrode could be deposited successively in the same vacuum chamber before the substrate is removed. When the three aforementioned layers are deposited successively without being removed from the vacuum chamber, they would then form a laminate or sandwich which was not subject to impurities. Attempts to remove portions of the sandwich by etching or milling have not proven successful. Chemical etching of the upper electrode cannot be controlled precisely and will destroy part of the base electrode. Ion beam milling can be controlled more precisely, but is still not accurate enough to mill away the upper layers and delineate the barrier junction without attacking the base electrode. It is known that ion beam milling of a layer will redeposit material on the side wall where the cut is made. Thus, ion beam milling and plasma etching etc. can redeposit superconductive material on the side wall and cause shorts. Both chemical etching and the aforementioned milling processes can cause shorts and undercuts at the tunnel barrier junction.

Copending application Ser. No. 179,331 filed Aug. 18, 1980 and entitled "Josephson Tunnel Junction Device and Method of Manufacture" by Harry Kroger is assigned to Sperry Corporation (the same assignee as the present invention assignee). This copending application teaches a method of making Josephson superconducting devices employing niobium and/or niobium nitride. It is well known that niobium and niobium nitride are anodizable materials. Portions of the counter electrode made of niobium may be changed from a superconducting material to a resistive material by anodization or oxidation of the niobium counter electrode layer after it is deposited. This technique will result in delineating the tunnel barrier junction by leaving a portion of the counter electrode unanodized. The aforementioned method and structure taught in this copending application are not applicable to the manufacture of lead alloy Josephson junction superconducting devices because lead and lead-alloys cannot be anodized to produce a resistive lead material.

Accordingly, it would be desirable to produce lead and lead-alloy electrodes for Josephson junction superconducting devices with a tunnel barrier junction therebetween in a vacuum chamber environment without having to remove the device from the vacuum chamber. This would permit the manufacture of the two electrodes and the tunnel barrier junction without being subject to the introduction of impurities.

SUMMARY OF THE INVENTION

It is a primary object of the present invention to provide a method of making the active elements of a lead base material Josephson superconducting device on a substrate without removing the substrate from the vacuum chamber.

It is another primary object of the present invention to provide a series of novel method steps which define the tunnel barrier junction area on a layer of tunnel barrier junction material.

It is another object of the present invention to provide a counter electrode of superconducting lead material which is transversely non-conducting and which may be patterned after being deposited on top of a layer of tunnel barrier material.

It is a general object of the present invention to provide a method of making a plurality of Josephson superconducting devices on a single substrate which may be interconnected by wire bonding or by photolithographically produced conductive paths or leads.

It is another object of the present invention to provide a novel Josephson superconducting device in which the base electrode is made of superconducting lead material in which a portion of the base electrode is patterned so that it is transversely non-conductive.

According to these and other objects of the present invention, there is provided an insulating substrate which is placed in a high vacuum environment at approximately $1.0 \times 10^{-6}$ torr. An inert gas is metered into the high vacuum system to increase the vacuum pressure to approximately 10 to $30 \times 10^{-3}$ torr. A superconductive lead material is then vacuum deposited on the insulating substrate which is provided with a predetermined pattern of transversely non-conductive lead material to produce a base electrode layer which is partially transversely conducting and is transversely non-conducting at the area which is deposited over the aforementioned transversely non-conducting pattern layer. The base electrode so deposited is maintained in the same vacuum chamber and a tunnel barrier layer is formed thereon by either oxidation or vacuum deposition of a suitable material such as silicon or aluminum. While maintaining the same substrate in the same vacuum chamber, a counter electrode is deposited on top of the tunnel barrier layer employing lead base superconductive material which is transversely non-conducting. The laminar structure, which includes the substrate, the counter electrode, the base electrode and the tunnel barrier layer is removed from the vacuum chamber environment to permit appropriate portions of the counter electrode to be patterned so that they delineate a window or area which connects to the tunnel barrier junction. Thus, the active layer elements of a Josephson junction device employing superconducting lead base material may be made without exposing the active elements to impurities outside of the vacuum chamber.

DESCRIPTION OF THE PREFERRED EMBODIMENT

For purposes of this application, the term transversely non-conducting has been applied to the resistivity of a vacuum deposited superconducting lead material which is normally superconducting in the vertical direction and exhibits resistivity in the transverse direction which is substantially infinite.

In my copending application, Ser. No. 362,568 filed Mar. 26, 1982 a method is disclosed of making high reliability lead-alloy electrode material. It was found that when lead-alloy base electrode materials were vacuum deposited in the presence of relatively high pressure inert gases, such as argon, that the conductivity decreased but could be controlled and the lead-alloy deposited as a uniform and stable superconducting material.

In my copending application, Ser. No. 424,923 filed Sept. 27, 1982 a method is disclosed of making transversely non-conducting lead-alloy material employing a normally superconducting lead-alloy. It was found that when lead-alloy base electrode material was deposited in the presence of a high pressure inert gas, such as argon, that the conductivity in the transverse direction could be controlled to the point to where the resistivity in the transverse direction was made substantially infinite.

For purposes of this application, it will now be understood that stable lead-alloy electrode materials can be deposited so that their normal resistivity at room temperature is increased and yet when they are placed in a cryogenic environment, they still become superconductive in both directions. Further, it will be understood that when such lead-alloy electrode materials were vacuum deposited in the presence of high pressure inert gas that the conductivity in the direction transverse to the layer thickness could be controlled so that the resistivity in the transverse direction was substantially infinite and remain substantially so under a cryogenic environment.

Figure 1:
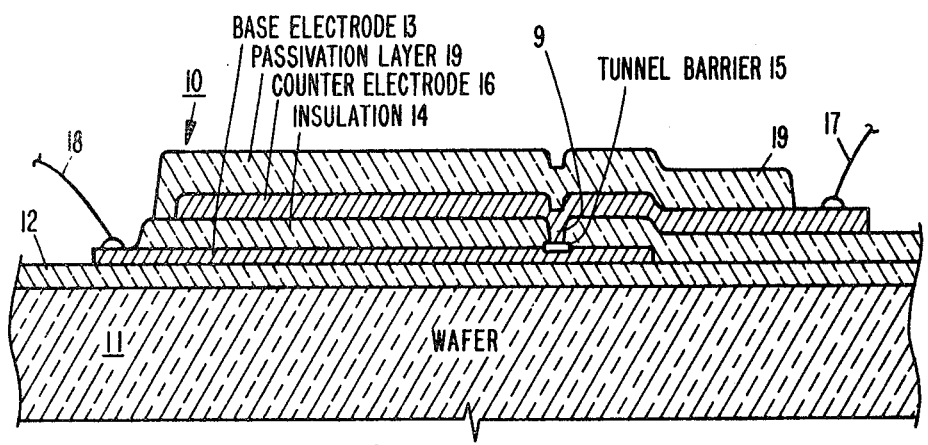
FIG. 1 is a schematic cross-section view of a typical prior art Josephson junction device showing a base electrode and a tunnel barrier junction that were made in different pump down steps in a vacuum chamber.

Refer now to FIG. 1 which is a schematic cross-section view of a typical prior art Josephson junction device. A plurality of such Josephson junction devices may be made simultaneously on the same substrate wafer 11 which has been cut and polished for use in the manufacture of semiconductor devices and superconductive devices. The standard silicon substrate wafer 11 is approximately 13 mils thick and has a thermally grown silicon dioxide ($SiO_2$) layer formed thereon which insulates and isolates the conductive silicon from the Josephson junction device being made. The insulation layer 12 has deposited thereon, a layer or a series of layers shown as the base electrode 13 which was commonly made from lead or lead-alloys or alternatively from niobium or niobium-alloys. After the base electrode 13 was made in a vacuum chamber, it was removed from the vacuum chamber and a mask applied which defined the window area 9 of the base electrode 13. The insulation layer 14 was then vacuum deposited over substantially all of the base electrode surface 13 except for the area where the mask had been applied to define the window or aperture 9 in which the tunnel barrier junction 15 was later deposited. A counter electrode 16 was deposited in a subsequent pump down after the production of the tunnel barrier junction 15. In a separate and distinct step after removal from the vacuum chamber, the passivation layer 19 was applied and the wire bonds 17 and 18 attached to the counter electrode 16 and the base electrode 13 to form an electrical circuit path from the terminal 18 on base electrode 13 through the tunnel barrier junction 15 to the counter electrode 16 and the wire terminal 17.

Figure 2:
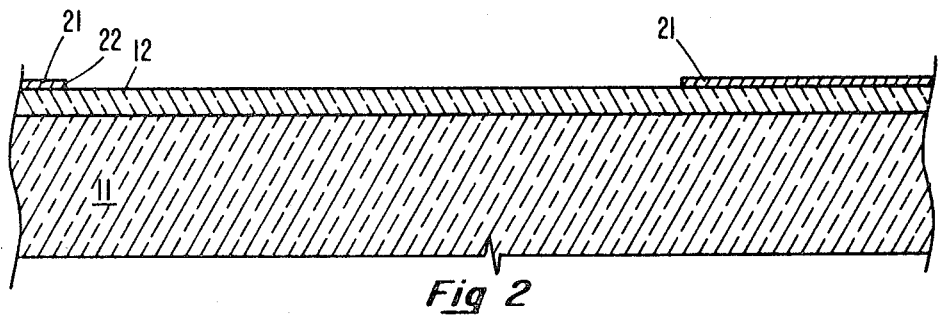
FIG. 2 is a schematic cross-section view of an insulating substrate having a novel transverse non-conducting lead base pattern thereon before the deposition of two electrode layers and a tunnel barrier layer.

Refer now to FIG. 2 showing the first step in producing the new and improved lead-alloy Josephson junction device. A substrate wafer 11 having an insulation oxide layer 12 thereon is prepared by having placed thereon a thin transversely non-conducting lead-alloy material 21. The transversely non-conducting layer 21 is preferably made approximately four hundred angstroms thick and is patterned using known photoresist methods to produce an open area or aperture 22 having the shape desired to form the base electrode. After the substrate 11, 12 shown in FIG. 2 is properly prepared, it is placed in the vacuum chamber in which lead base electrode materials and tunnel barrier junction materials are present.

Figure 3:
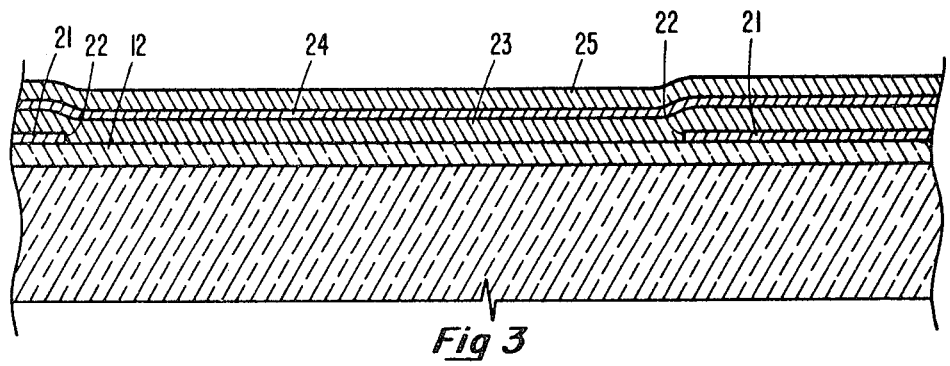
FIG. 3 is a schematic cross-section view of the insulating substrate of FIG. 2 after the deposition of two electrode layers and a tunnel barrier layer during the same pump down in a vacuum chamber.

Refer now to FIG. 3 showing the deposited active layer of the Josephson junction device. After the vacuum chamber is pumped down to a high vacuum of approximately $1.0 \times 10^{-6}$ torr, an inert gas, such as argon, is now metered into the vacuum chamber so that the partial vacuum pressure is increased to the point where it is less than $18 \times 10^{-3}$ torr for the deposition of the base electrode 23. After deposition of the lead-alloy base electrode 23 as a uniform layer, a tunnel barrier layer 24 may be applied either by oxidation or vacuum deposition of a suitable tunnel barrier material. Again the substrate remains in the vacuum chamber and the vacuum chamber is pumped down to a high vacuum of approximately $1 \times 10^{-6}$ torr. After pumping the vacuum chamber down, an inert gas is metered into the vacuum chamber to produce a stabilized partial vacuum pressure in the range of 18 to $100 \times 10^{-3}$ torr. The lead-alloy counter electrode 25 is now deposited on top of the tunnel barrier junction layer 24 so that the complete layer 25 has the aforementioned characteristics of being transversely non-conducting and further being vertically conducting. It was found that the stable base electrode layer 23 which was formed over the transversely non-conducting pattern 21 is also transversely non-conducting in the region directly over the pattern layer 21. The portion of the base electrode 23 which is in the aperture area 22 is vertically and transversely conducting.

Figure 4:
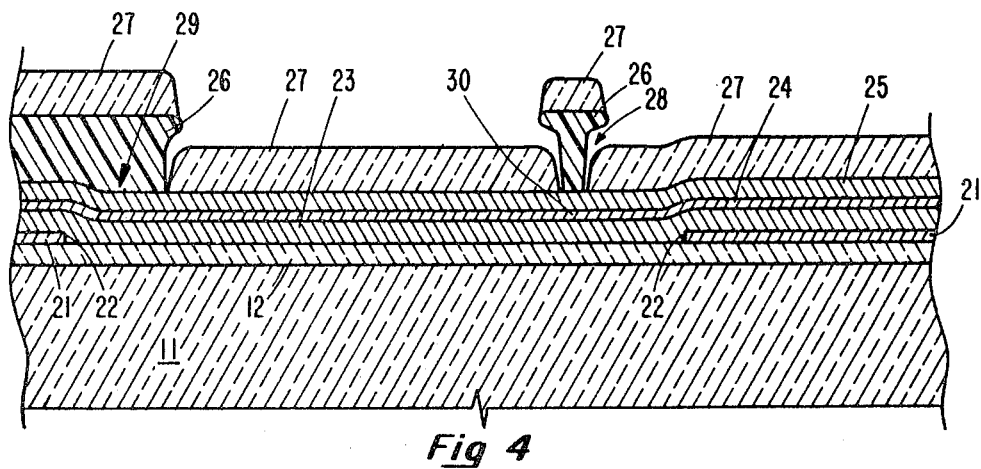
FIG. 4 is a schematic cross-section view of the partially complete Josephson junction device of FIG. 3 after a lift-off photoresist pattern has been applied and an insulating layer has been applied on top of the pattern and the counter electrode.

Refer now to FIG. 4 which is a schematic cross-section of the partially complete device shown in FIG. 3 after it has been removed from the vacuum chamber and had a mushroom lift-off photoresist pattern 26 applied thereto. The portion of the mushroom lift-off photoresist pattern at the left-hand edge of FIG. 4 is employed to define a terminal area 29 for the counter electrode. The lift-off mushroom pattern 26 in the center of FIG. 4 is employed to define the exact area at which the tunnel barrier junction will be delineated. After the deposition of the insulation layer 27, the partially completed device is again removed from the vacuum chamber and the lift-off photoresist pattern 26 and the portion of the insulation layer 27 thereon is removed.

A new photoresist pattern is applied over the insulation layer 27 and portions of the counter electrode layer 25 at the terminal area 29. The tunnel barrier junction area 30 is formed below the window or aperture 28 between the two portions of insulation layer 27 shown in FIG. 5. Into this window or aperture 28 is deposited a conductive path or lead 31. The partially complete device is then removed from the vacuum chamber and the photoresist pattern is removed leaving the partially complete Josephson junction device shown in FIG. 5. As explained hereinbefore, the counter electrode 25 has been made transversely non-conducting. However, the area 32 of electrode 25 directly under the window 28 is electrically connected to the terminal 31 and is vertically conducting so that the lead 31 is effectively in electrical contact with the tunnel barrier junction area 30 directly below the window 28. The tunnel barrier layer 24 conducts vertically. It is only approximately forty angstroms thick and electrical current tunnels vertically through this junction and is not transversely dissipated and attenuated. The base electrode 23 below the window 28 and the area 30,32 is both transversely and vertically conducting so that it is electrically connected to the terminal pad area 29. Since the terminal pad area 29 is very large with respect to the tunnel barrier junction area 30, electricity flows from the superconducting lead 31 and counter electrode material 25, 32 through the oxide layer 24 and back to the terminal pad area 29 through the transversely conducting portion of the base electrode 23. Since the terminal pad area 29 is very large, the critical current in the oxide layer 24 directly beneath pad area 29 is never reached and remains superconductive during normal operation of the Josephson junction device.

Test results have shown that the area beneath the terminal pad area 29 never reaches the critical current state and terminals connected to this pad area 29 are effectively electrically connected to the base electrode 23. Further, the terminal or lead out 31 is electrically connected through the portion 32 of the counter electrode 25 to the oxide layer 24. The oxide layer 24 beneath the area 32 is also connected to the base electrode 23 thus forming the predetermined small area 30 for the tunnel barrier junction. The tunnel barrier junction 30 as mentioned hereinbefore is approximately forty angstroms thick and may be a few microns in diameter or on each side. The base electrode 23 is preferably made approximately two thousand angstroms thick and the counter electrode is also made approximately two thousand angstroms thick. Since the non-conducting pattern layer 21 is only approximately four hundred angstroms thick, it will be appreciated that the layers deposited on top of the substrate are substantially parallel and laminar even though they have been exaggerated for purposes of illustration.

Figure 5:
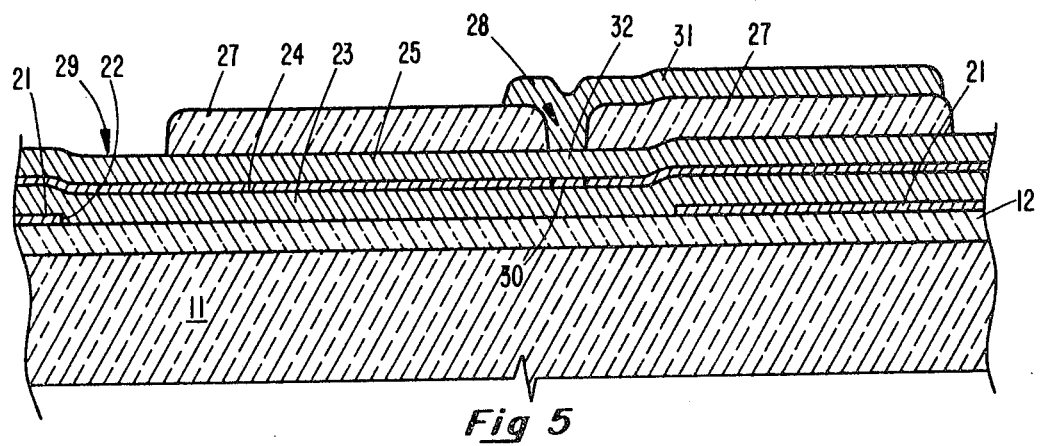
FIG. 5 is a schematic cross-section view of the partially complete Josephson junction device shown in FIG. 4 after the photoresist pattern has been removed to expose the tunnel barrier junction area and a conductive path or lead-out has been deposited thereon.
Figure 6:
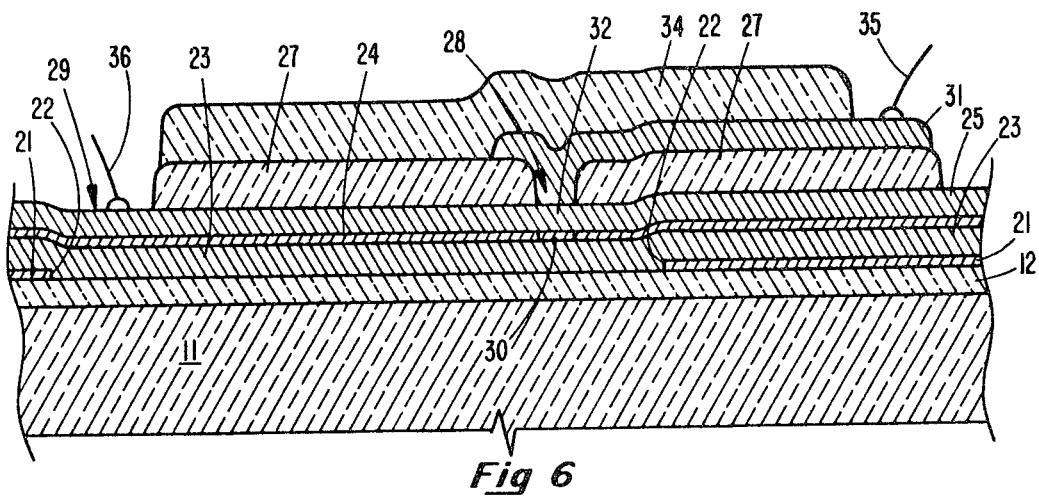
FIG. 6 is a schematic cross-section view of the Josephson junction device shown in FIG. 5 after a passivation layer has been added and wire bonds made which connect to the two electrodes to make a complete device.

The partially complete Josephson junction device shown in FIG. 5 may be completed as shown in FIG. 6 by the addition of a passivation layer 34. The end portion of terminal 31 may be left exposed for making a wire bond connection 35 to the counter electrode 25 via the terminal 31. In similar manner a wire bond 36 may be made to the terminal pad 29 which is electrically connected to the base electrode 23. In the preferred embodiment shown in FIG. 6, the transversely non-conducting layer 21 and the transversely non-conducting portion of the base electrode 23 directly over layer 21 may be employed to isolate and define individual Josephson junction devices. However, an open pattern may be formed by the transversely non-conducting layer 21 to allow the base electrode 23 to be connected to adjacent devices or all of the devices on the same substrate. In the latter instance when the base electrode is connected to all of the other base electrodes on the same substrate, the base electrode is then employed as a ground plane.

Figure 7:
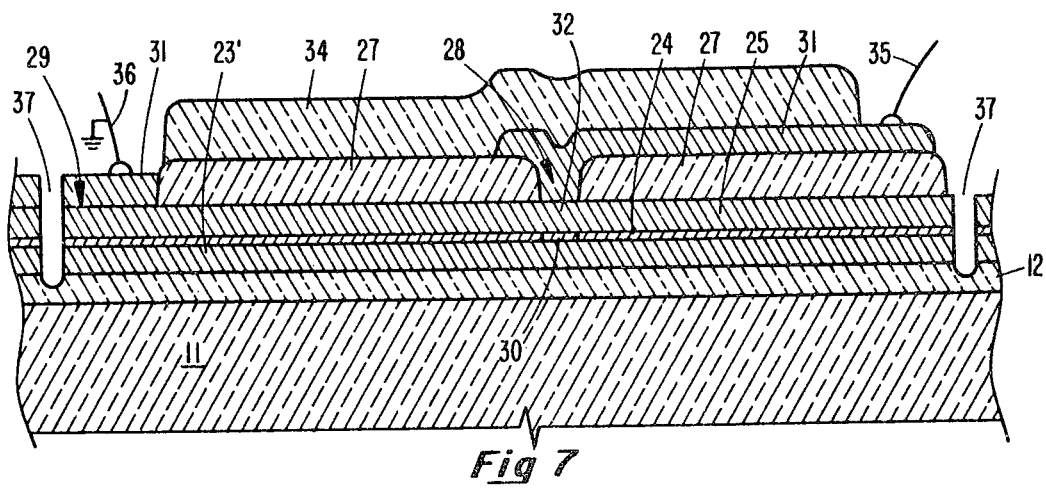
FIG. 7 is a schematic cross-section view of a modified embodiment of the completed Josephson junction superconducting device shown in FIG. 6.

Refer now to FIG. 7 which is a modification of the preferred embodiment Josephson junction device shown in FIG. 6. It will be noted that the transversely non-conducting pattern layer 21 and its associated aperture 22 has been eliminated from the substrate 11, 12 onto which the Josephson junction device is made. The first layer laid down is the base electrode 23' which now by virtue of elimination of the pattern layer is a base electrode ground plane. When the oxidation layer 24 and the counter electrode layer 25 are formed on top of the base electrode 23', they form a sandwich in which the base electrode 23' is transversely conducting and the counter electrode 25 is transversely non-conducting. The area 32 below the window 28 is vertically conducting and transversely non-conducting thus, current will flow from the terminal or lead-out 31 through the window area 28 and vertically through the portion 32 of the counter electrode 25 into the tunnel barrier junction area 30 and enters the ground plane base electrode 23'. The wire bonds 35 and 36 are applied to the conductive lead material 31 to provide connections to the counter electrode 25 and the base electrode 23' respectively. It will be noted that the conductive lead material may be applied to the terminal pad area 29 or the wire bond 36 may be made directly onto the counter electrode 23' which is approximately two thousand angstroms thick and is sufficiently rigid and conductive to permit wire bonding thereto.

If it is desirable to isolate individual Josephson junction devices on a wafer employing the modifying embodiment structure shown in FIG. 7, it is necessary to cut isolation channels 37 down through the layers preferably to extent into the substrate. If the isolation channel 37 is made by ion milling or laser beam evaporation, it is possible that some conductive material may be deposited on the side wall of the isolation channel 37. However, since the base electrode is already transversely conducting and the counter electrode is made so it is transversely non-conducting, no current should be able to flow through the side wall and make the device inoperative. Channel 37 is wide compared to the thickness of the layers, thus, it will be understood that the width of the isolation channel 37 and the thickness of the layers shown in FIGS. 1 to 7 have been exaggerated to better explain the present invention.

Figure 8:
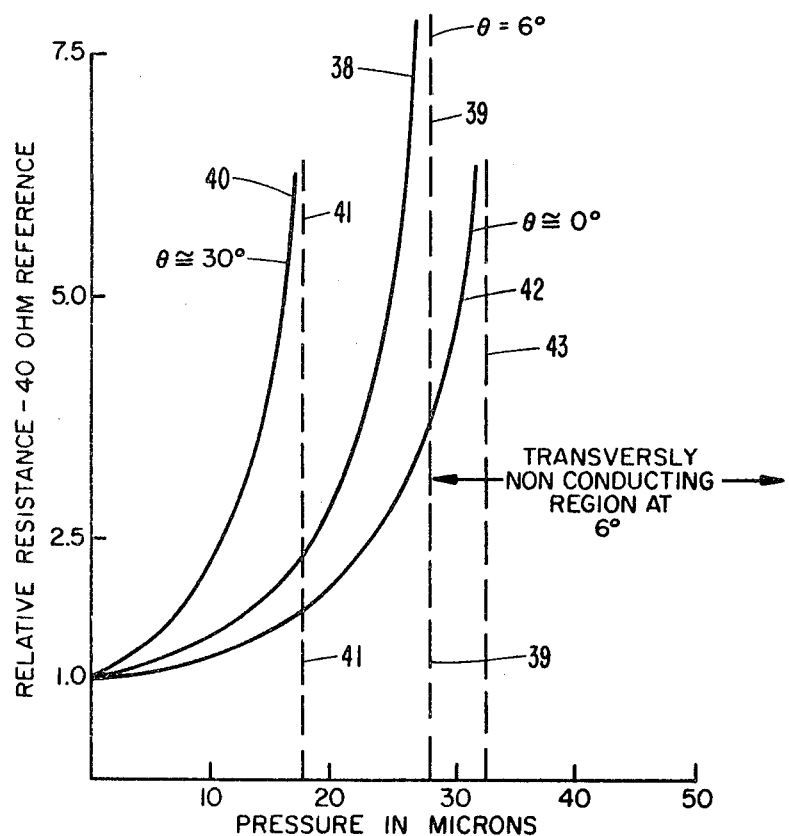
FIG. 8 is a graph of pressure in microns versus relative resistance in ohms of superconducting lead materials which have been vacuum deposited in the presence of inert gas to produce transverse conducting and/or transversely non-conducting electrode material.

Refer now to FIG. 8 which is a graph of the inert gas pressure in microns versus the relative resistance of the deposited lead reference superconductive electrode material. The relative resistance employed in this series of measures and experiments was forty ohms and is used to denote the room temperature resistance of a standard base electrode pattern. When the lead or lead-alloy electrode material employed in the base and counter electrodes shown in FIGS. 2 to 7 is deposited at an angle theta equal to approximately six degrees from the point of deposition to the substrate on which it is deposited, a preferred embodiment superconductive base electrode material is formed. The six degree deposition curve 38 shows the relative resistivity of the lead-alloy base electrode under different pressures of argon inert gas environment. There is a vertical boundary line 39 associated with the six degree deposition curve 38 for the lead-alloy superconductive material. The resistivity rises as the inert gas pressure is raised. When the relative resistance reaches a factor greater than five, the six degree deposition curve 38 becomes asymptotic to the vertical boundary line 39 so that material deposited to the right of line 39 becomes transversely non-conducting. In similar manner when depositing superconducting lead-alloy material to form the curve 38, it was noted that the relative resistance is lowered as the argon inert gas pressure is lower so that the highly stable material deposited to the left of the vertical boundary line 39 is both vertically conducting and transversely conducting. In order to be assured that the material which is desired to be both vertically conducting and transversely conducting has the desired properties, the material is preferably deposited well to the left or right of the boundary line 39 while maintaining the angle of deposition approximately six degrees.

In order to illustrate how the angle of deposition may affect the region which is transversely non-conducting and transversely conducting material is made, the same superconducting lead-alloy material was deposited at an angle theta which is approximately thirty degrees as shown by deposition curve 40. It will be noted that the vertical boundary line 41 associated with the thirty degrees angle of deposition curve 40 will result in producing transversely non-conducting lead base alloy material at an argon pressure of approximately eighteen microns. Thus, when the angle of deposition reaches the maximum preferred angle of thirty degrees, it is necessary only to raise the argon inert pressure slightly above twenty microns to assure that the material deposited is transversely non-conducting.

A third deposition curve 42 is shown wherein the superconducting lead base alloy material was deposited at an angle theta which is approximately zero degrees or directly opposite from the substrate. The associated vertical boundary line 43 shows that material deposited at over thirty-two microns of pressure in an argon atmosphere will produce transversely non-conducting material. Similarly, if the argon inert pressure is reduced substantially below thirty microns and the angle of deposition is maintained at approximately zero degrees, then the material is deposited in the region to the left of the vertical boundary line 43 assuring that the superconducting lead base material is both transversely and vertically conducting.

Having explained that lead and lead-alloy superconducting metals have successfully been deposited under controlled inert gas atmospheres to produce both transversely conducting and transversely non-conducting materials, it will be understood that it is also possible to deposit a material which will ordinarily be transversely conducting on top of a layer of material which is transversely non-conducting so as to make that portion of the last deposited material which is applied over the transversely non-conductive layer to also be transversely non-conducting.

Having explained the present invention with respect to a preferred embodiment employing lead-alloys, it will be understood that lead and other superconducting materials may be deposited without alloy materials. The preferred alloy materials employed with lead electrodes for Josephson junction devices are bismuth, indium and gold in which the percentage of lead is maintained at least fifty percent. Further, the highest quality barriers in the Josephson junction devices have been made by radio frequency oxidation of the base electrode material. The counter electrode materials which are presently preferred are lead-alloys employing gold or bismuth as the alloy material. The leads or terminals 31 which can form a lead-out or an interconnection are preferably made from lead and gold alloy. The present invention Josephson junction devices may be made employing combinations of materials other than lead.

In the present invention, the basic principle of making the counter electrode of a transversely non-conducting material has advantages which were not possible heretofore when employing lead and lead-alloy superconducting materials. Clearly, the base electrode layer, the barrier junction layer and the counter electrode layer may be deposited in one pump down in the same vacuum chamber so as to avoid contamination of the barrier junction area. The tunnel barrier junction area 30 is then delineated without changing or disturbing the deposited materials. Another advantage of the present method and Josephson junction device produced thereby is that it is substantially planar and does not have abrupt steps or stress concentration areas such as those shown in FIG. 1 which would produce device failure due to stress concentrations.

Those skilled in the art of manufacturing lead based Josephson junction devices will recognize that it is possible to reverse the structural function of the base electrode with the function of the counter electrode in the device shown in FIG. 6. Accordingly, the base electrode may be made transversely non-conducting so that it will provide the vertically conducting path or portion 32 through the base electrode to the tunnel junction 30. This will permit the counter electrode 25 to be made both vertically and transversely conducting. Reversing the function of the two electrodes requires that a lead-out terminal like terminal 31, be made on the substrate 11, 12. If this lead-out terminal is to perform the function of terminal 31, it must have a window or aperture area like area 28 which is provided by an insulation layer similar to layer 26. When the window 28 is placed above the base electrode, the subsequently deposited tunnel barrier layer and counter electrode layer are no longer planar and cause the area of the tunnel barrier junction 30 to be distorted.

If an attempt is made to avoid the window or aperture 28 above the transversely non-conducting base electrode, then the substrate must be removed from the vacuum chamber after the window area 28 is defined and the window area must be filled with a conductive metal via to planarize the window or aperture 28. The conductive via requires an extra mask step, thus, it is possible to introduce an error in mask registration in addition to having to remove the partially complete substrate from the vacuum chamber before depositing the three active layers.

We claim:

1. The method of manufacturing electrodes and a tunnel barrier junction therebetween for Josephson superconducting devices without removing the devices in process from a vacuum chamber, comprising the steps of:

providing an insulating substrate in a vacuum chamber, evaporating and depositing on said substrate a base electrode layer of superconducting material comprising lead, depositing over the exposed surface of said base electrode layer a tunnel barrier layer, evaporating and depositing on top of said tunnel barrier layer the counter electrode layer of superconducting material comprising lead to complete two electrodes and a tunnel barrier layer therebetween without removing the substrate from said vacuum chamber, said counter electrode layer being deposited in the presence of an inert gas atmosphere in said vacuum chamber at a partial vacuum pressure to provide a counter electrode layer which is vertically conductive and transversely non-conductive, removing said substrate from said vacuum chamber, providing a lift-off photoresist pattern on top of said counter electrode layer which defines the area of said counter electrode over the tunnel barrier junction of said Josephson superconducting devices, returning said substrate to said vacuum chamber, depositing an insulating layer on top of said counter electrode layer and said lift-off photoresist pattern, removing said substrate from said vacuum chamber, removing said lift-off pattern leaving areas of said counter electrode over said tunnel barrier junction exposed, providing a photoresist pattern comprising an open aperture over portions of said counter electrode layer which is over said tunnel barrier junctions, returning said substrate to said vacuum chamber, and depositing a conductive path in said open aperture of said photoresist pattern to provide a Josephson junction superconducting device.

2. The method as set forth in claim 1 which further includes the steps of adding a passivation layer over said conductive path.

3. The method as set forth in claim 2 wherein the steps of adding a passivation layer further includes the step of leaving an exposed terminal pad portion of said conductive path.

4. The method as set forth in claim 1 wherein the steps of depositing a conductive path further comprises extending said conductive path to interconnect other Josephson junction superconducting devices on the same substrate.

5. The method as set forth in claim 3 which further includes wire bonding conductive leads to said exposed terminal pad portions of said conductive path to interconnect individual Josephson junction superconducting devices into a circuit.

6. The method as set forth in claim 3 which further includes the steps of:

isolating individual Josephson junction superconducting devices on said substrate by cutting isolation channels down through said counter electrode layer.

7. The method as set forth in claim 6 wherein the step of cutting isolation channels includes cutting through said counter electrode layer and said base electrode layer.

8. The method as set forth in claim 6 wherein the steps of cutting isolation channels further includes cutting by ion milling.

9. The method as set forth in claim 6 wherein the steps of cutting isolation channels further includes cutting by laser evaporation.

10. The method as set forth in claim 1 which further includes the step of:

providing a predetermined thin pattern layer of vertically conductive and transversely non-conductive superconductive material on said substrate before the step of evaporating and depositing on said substrate a base electrode layer of superconductive material comprising lead.

11. The method as set forth in claim 10 wherein the step of evaporating and depositing a base electrode layer of superconducting material comprises depositing said base electrode layer in the presence of an inert gas atmosphere in said vacuum chamber, said base electrode layer being transversely and vertically conductive at the portion of said base electrode layer which is deposited directly on said substrate and vertically conductive and transversely non-conductive at the portion of said base electrode layer deposited over said transversely non-conductive thin pattern layer.

12. A method as set forth in claim 11 wherein said thin pattern layer of vertically conductive and transversely non-conductive superconductive material is deposited in an inert gas atmosphere at a partial vacuum pressure of approximately 18 to $100 \times 10^{-3}$ torr.

13. A method as set forth in claim 12 wherein said base electrode layer of superconductive material is deposited in an inert gas atmosphere at a partial vacuum pressure of approximately 10 to $30 \times 10^{-3}$ torr.

14. The method of manufacturing electrodes and a tunnel barrier junction therebetween for Josephson superconducting devices without removing the device in process from a vacuum chamber, comprising the steps of:

providing an insulating substrate, placing said insulating substrate in a vacuum chamber environment, evaporating and depositing on said substrate a base electrode layer of superconducting material comprising lead, oxidizing said base electrode layer to provide a tunnel barrier layer over said base electrode layer, providing an inert gas in said vacuum chamber to stabilize the pressure at a partial vacuum pressure in the range of 18 to $100 \times 10^{-3}$ torr, evaporating and depositing on said tunnel barrier layer a counter electrode superconducting material layer comprising lead which is vertically conductive and transversely non-conductive, removing said substrate and said built up layers from said vacuum chamber, providing a photoresist mushroom lift-off pattern over a predetermined area of said counter electrode which defines a tunnel barrier junction area, returning said substrate with said lift-off pattern to said vacuum chamber environment, depositing an insulating layer over said counter electrode and said lift-off pattern, removing said lift-off pattern and said substrate from said vacuum chamber, removing said lift-off pattern and said insulating layer thereon to provide a window over said counter electrode at said predetermined tunnel barrier junction area, providing a photoresist pattern over said insulating layer leaving said window at said tunnel barrier junction area exposed, returning said substrate to said vacuum chamber environment, depositing a superconducting path into said window and said tunnel barrier junction area and on portions of said insulating layer to define a tunnel barrier electrode area and to form a lead-out connection, removing said substrate from said vacuum chamber, and removing said photoresist pattern and said superconducting path material thereon leaving a Josephson superconducting device.

* * * * *